US008648344B2

(12) United States Patent
Kim et al.

(10) Patent No.: US 8,648,344 B2
(45) Date of Patent: Feb. 11, 2014

(54) ORGANIC LIGHT-EMITTING DISPLAY DEVICE AND METHOD OF MANUFACTURING THE SAME

(75) Inventors: Kwang-Hae Kim, Yongin (KR); Sun Park, Suwon-si (KR); Chun-Gi You, Asan-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 158 days.

(21) Appl. No.: 13/208,509

(22) Filed: Aug. 12, 2011

(65) Prior Publication Data

US 2012/0235146 A1    Sep. 20, 2012

(30) Foreign Application Priority Data

Mar. 15, 2011    (KR) .................. 10-2011-0022953

(51) Int. Cl.
*H01L 33/16*    (2010.01)
(52) U.S. Cl.
USPC .......... 257/59; 257/72; 257/99; 257/E33.003; 257/E33.075; 257/E29.273; 438/27
(58) Field of Classification Search
None
See application file for complete search history.

(56) References Cited

U.S. PATENT DOCUMENTS

| 5,218,177 A * | 6/1993 | Coleman et al. ............... 200/5 A |
| 2005/0117093 A1* | 6/2005 | Kim et al. ..................... 349/106 |
| 2007/0009192 A1* | 1/2007 | Sung et al. .................... 384/463 |
| 2007/0267648 A1* | 11/2007 | Hwang et al. ................... 257/99 |
| 2008/0003380 A1* | 1/2008 | Kim et al. ...................... 428/1.1 |
| 2009/0058294 A1* | 3/2009 | Joo et al. ....................... 313/512 |
| 2009/0189517 A1* | 7/2009 | Choi et al. .................... 313/504 |
| 2010/0044692 A1* | 2/2010 | Kim et al. ....................... 257/40 |
| 2010/0242629 A1* | 9/2010 | Leuenberger et al. ... 73/862.625 |

FOREIGN PATENT DOCUMENTS

| KR | 10-2007-0033111 | 3/2007 |
| KR | 10-0761161 | 9/2007 |
| KR | 10-0978667 | 8/2010 |

* cited by examiner

*Primary Examiner* — Minh-Loan T Tran
*Assistant Examiner* — Fazli Erdem
(74) *Attorney, Agent, or Firm* — Robert E. Bushnell, Esq.

(57) ABSTRACT

An organic light-emitting display device comprises: a lower substrate; an upper substrate facing the lower substrate; and a spacer formed in a sealed space between the lower substrate and the upper substrate and dividing the space into two or more sections; wherein air holes are formed in the spacer and allow air to flow between the sections of the space.

17 Claims, 8 Drawing Sheets

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 15 Mar. 2011 and there duly assigned Ser. No. 10-2011-0022953.

BACKGROUND OF THE INVENTION

1. Field of the Invention

The present invention relates to an organic light-emitting display device and a method of manufacturing the same, and more particularly, to an organic light-emitting display device and a method of manufacturing the same, in which the damage to a substrate and/or a spacer in the processing of attaching a polarizing film to the substrate can be minimized.

2. Description of the Related Art

The rapid development of the information technology (IT) industry is dramatically increasing the use of display devices. Recently, there have been demands for display devices which are lightweight and thin, consume low power and provide high resolution. To meet these demands, liquid crystal displays or organic light-emitting displays using organic light-emitting characteristics are being developed.

In an organic light-emitting element, holes and electrons injected from an external source combine together in an emitting layer to form excitons as they disappear. The excitons transfer energy to fluorescent molecules of the emitting layer as they transit from an excited state to a ground state. Accordingly, the fluorescent molecules emit light, thereby forming an image.

Organic light-emitting displays are classified into top emission organic light-emitting displays and bottom emission organic light-emitting displays according to the direction of light emission. An organic light-emitting display is manufactured by putting spacers and a sealant between an upper substrate and a lower substrate, and bonding the upper substrate and the lower substrate together.

To improve image characteristics, the process of attaching a polarizing film to the upper substrate and/or the lower substrate may be additionally performed after the upper substrate and the lower substrate are bonded together. In this process, a polarizing film is ii aligned with a side of a substrate and then attached to a surface of the substrate by pressing the polarizing film against the surface of the substrate along a predetermined direction using a pressure roller.

In this regard, since the pressure roller moves while applying pressure to the surface of the substrate, the pressure in the space between the lower substrate and the upper substrate increases along the direction in which the pressure roller moves.

After an encapsulation process, the space between the lower and upper substrates is filled with approximately 5,000 Pa of nitrogen gas. Thus, as the pressure roller moves, the nitrogen gas in the space accumulates along the direction in which the pressure roller moves, thereby significantly increasing the pressure in the space. An increase in stress due to the increased internal pressure is sharper, particularly in large-sized display devices.

Ultimately, during the process of attaching the polarizing film to the substrate, the internal pressure in front of the pressure roller sharply increases to such an extent that the sealant, the upper substrate, or the lower substrate in front of the pressure roller in motion becomes unable to withstand the increased pressure and, as a result, is damaged.

SUMMARY OF THE INVENTION

The present invention provides an organic light-emitting display device and a method of manufacturing the same, in which damage to a sealant or a lower or upper substrate can be prevented by maintaining the pressure in a sealed space between the lower and upper substrates constant, even when a pressure roller presses a polarizing film against the lower or upper substrate to attach the polarizing film to the lower or upper substrate.

However, aspects of the present invention are not restricted to the ones set forth herein. The above and other aspects of the present invention will become more apparent to one of ordinary skill in the art to which the present invention pertains by referencing the detailed description of the present invention given below.

According to an aspect of the present invention, an organic light-emitting display device comprises: a lower substrate; an upper substrate facing the lower substrate; and a spacer formed in a sealed space between the lower substrate and the upper substrate and dividing the space into two or more sections; wherein air holes are formed in the spacer and allow air to flow between the sections of the space.

According to another aspect of the present invention, an organic light-emitting display device comprises: a lower substrate; a thin-film transistor formed on a surface of the lower substrate; a pixel portion defined by a pixel defining layer and having an organic layer which emits light when receiving a driving voltage from the thin-film transistor; a spacer formed on the pixel defining layer in the shape of a line; and an upper substrate closely attached to the spacer and facing the lower substrate with a predetermined gap therebetween; wherein air holes are formed in the spacer and allow air to flow through the spacer.

According to another aspect of the present invention, a method of manufacturing an organic light-emitting display device comprises: forming a thin-film transistor on a surface of a lower substrate; forming a pixel defining layer on the thin-film transistor; forming a pixel portion by etching the pixel defining layer; forming a spacer on the pixel defining layer; forming recessed grooves in the spacer in a direction perpendicular to a lengthwise direction of the spacer; and providing an upper substrate on the spacer.

According to another aspect of the present invention, a method of manufacturing an organic light-emitting display device comprises: forming a spacer on a lower substrate; forming recessed grooves in the spacer in a direction perpendicular to a lengthwise direction of the spacer; providing an upper substrate on the spacer; attaching a polarizing film to a surface of the upper substrate; and applying pressure to the upper substrate using a roller.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 7A thru 8C are views sequentially illustrating the process of attaching a polarizing film to a substrate included in the manufacturing method of FIG. 6.

DETAILED DESCRIPTION OF THE INVENTION

Hereinafter, exemplary embodiments of the present invention will be described with reference to the accompanying drawings.

Figure 1:
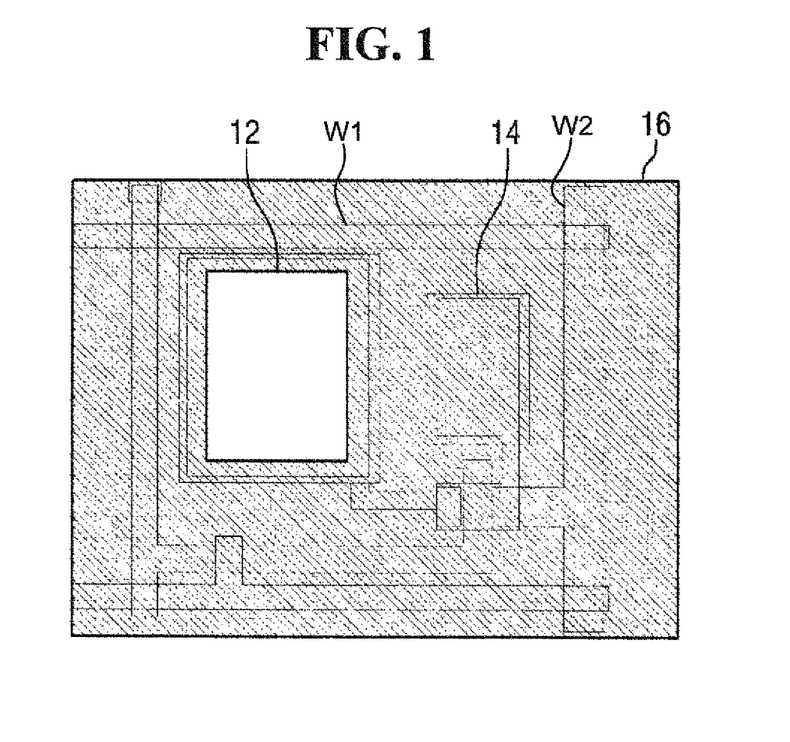
FIG. 1 is a plan view illustrating the internal structure of a panel of an organic light-emitting display device according to an exemplary embodiment of the present invention.
Figure 2:
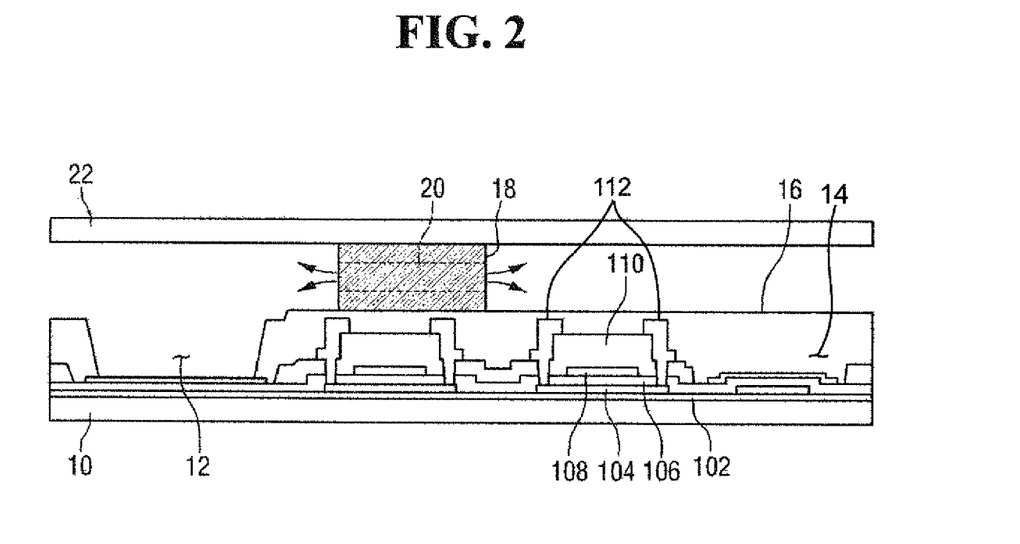
FIG. 2 is a cross-sectional view illustrating the entire stack structure of the organic light-emitting display device of FIG. 1.

FIG. 1 is a plan view illustrating the internal structure of a panel of an organic light-emitting display device according to an exemplary embodiment of the present invention, and FIG. 2 is a cross-sectional view illustrating the entire stack structure of the organic light-emitting display device of FIG. 1.

The organic light-emitting display device according to the current exemplary embodiment includes a lower substrate 10, a thin-film transistor (TFT) formed on a surface of the lower substrate 10, a pixel portion 12 defined by a pixel defining layer 16 and having an organic layer which emits light when receiving a driving voltage from the TFT, a spacer 18 formed on the pixel defining layer 16 in the shape of a line, and an upper substrate 22 closely attached to the spacer 18 and facing the lower substrate 10 with a predetermined gap therebetween. The air holes 20 are formed in the spacer 18 to allow air to flow through the spacer 18.

Referring to FIG. 1, in the organic light-emitting display device according to the current exemplary embodiment, a plurality of wirings W1, W2 intersect each other on the lower substrate 10 to form each pixel. In one pixel, one or more TFTs, a capacitor 14, and the pixel portion 12 having an exposed pixel electrode are formed.

The pixel portion 12 is defined by the pixel defining layer 16 as will be described later. The pixel defining layer 16 is formed on the whole surface of the lower substrate 10 excluding the pixel portion 12, thereby exposing the pixel electrode in the pixel portion 12. Then, an organic layer including an electron transporting layer, an electron injecting layer, a hole transporting layer and a hole injecting layer is formed in the pixel portion 12. In this state, if an electric field is generated between a cathode electrode and the pixel electrode, the organic layer emits light.

Specifically, referring to FIG. 2, a buffer layer 102, an active layer 104, a gate insulating film 106, a gate electrode 108, an interlayer insulating film 110, and source/drain electrodes 112 are sequentially formed on the lower substrate 10, and the pixel defining layer 16 is stacked on the resultant structure.

The lower substrate 10 may be made of a transparent glass material containing $SiO_2$ as a main component. However, the material which forms the lower substrate 10 is not limited to the transparent glass material. The lower substrate 10 may also be made of a transparent plastic material. In the case of a bottom emission organic light-emitting display device in which light emitted from the organic layer exits through the lower substrate 10, the lower substrate 10 should be made of a transparent material in order to not block the light. However, in the case of a top emission organic light-emitting display device, the lower substrate 10 may not necessarily be made of a transparent material.

The plastic material which forms the lower substrate 10 may be an insulating organic material selected from the group consisting of polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP).

As shown in FIG. 2, the buffer layer 102, the active layer 104, the gate insulating film 106, the gate electrode 108, the interlayer insulating film 110, and the source/drain electrodes 112 may be formed on the lower substrate 10. The above components may be provided on the whole surface of the lower substrate 10 or on part of the surface of the lower substrate 10 to form a TFT or a capacitor.

The buffer layer 102 may be formed on the lower substrate 10 so as to planarize the lower substrate 10 and prevent penetration of impurities into the lower substrate 10. The buffer layer 102 may be a single layer of SiOx, SiNx or $SiO_2Nx$, or a multilayer of these materials.

The active layer 104 may be formed on the buffer layer 102. The active layer 104 may be a semiconductor layer. For example, the active layer 104 may contain silicon (Si). Specifically, the active layer 104 may be an amorphous silicon (a-Si) layer or a polycrystalline silicon (p-Si) layer. Otherwise, the active layer 104 may be made of, but is not limited to, Ge, GaP, GaAs, or AlAs.

The active layer 104 may be formed by doping a portion of a semiconductor layer with P- or N-type impurities. In some embodiments, the active layer 104 which constitutes a TFT may be partially doped with impurities so as to have semiconductor properties, and the active layer 104 which constitutes a capacitor may be entirely doped with impurities so as to form an electrode.

The gate insulating film 106 may be formed on the active layer 104 to cover the active layer 104 and to insulate the active layer 104 from the gate electrode 108. Like the buffer layer 102, the gate insulating film 106 may be a single layer of $SiO_2$, SiNx or $SiO_2Nx$, or a multilayer of these materials. The gate insulating film 106 may be made of the same or different material as the buffer layer 102.

The gate electrode 108 may be formed on the gate insulating film 106. The gate electrode 108 transmits a gate signal to control the light emission of each pixel. The gate electrodes 108 may be a single layer of Al or an Al alloy, such as Cr—Al, Mo—Al or Al—Nd, or a multilayer of a Cr or Mo alloy and an Al alloy stacked on the Cr or Mo alloy. In addition, the gate electrodes 108 may contain one or more of ITO, Mo and Al.

The interlayer insulating film 110 may be formed on the gate electrode 108. The interlayer insulating film 110 electrically insulates the gate electrode 108 from the source/drain electrodes 112. Like the buffer layer 102, the interlayer insulating film 110 may be a single layer of $SiO_2$, SiNx or $SiO_2Nx$, or a multilayer of these materials. Contact holes for forming the source/drain electrodes 112 may be formed in the interlayer insulating film 110.

The source/drain electrodes 112 may be formed on the interlayer insulating film 110 and may be electrically connected to the active layer 104 by the contact holes. The source/drain electrodes 112 may be made of any one material selected from Mo, Cr, W, MoW, Al, Al—Nd, Ti, TiN, Cu, a Mo alloy, an Al alloy, and a Cu alloy. The source/drain electrodes 112 may also be formed as a triple layer of Mo—Al—Mo.

After the source/drain electrodes 112 are formed on the lower substrate 10, the pixel defining layer 16 is finally formed to define the pixel portion 12 which is open to expose the pixel electrode (anode electrode).

The pixel defining layer 16 is disposed on the source/drain electrodes 112 so as to cover the source/drain electrodes 112 and protect the internal components from the outside environment. The pixel defining layer 16 forms the pixel portion 12 which exposes all or part of the pixel electrode.

As described above, the organic layer including the electron transporting layer, the electron injecting layer, the hole transporting layer, and the hole injecting layer is formed on the pixel electrode in the pixel portion 12.

The pixel defining layer 16 may be made of an organic material containing one or more materials selected from a photosensitive polyimide (PSPI) material, an acrylic material, a siloxane material and a novolac material, or an inorganic material such as SiOX or SiNx.

The line-shaped spacer 18 is formed on the pixel defining layer 16. The spacer 18 maintains a predetermined gap between the upper substrate 22 and the lower substrate 10.

If an upper end of a spacer is closely attached to an upper substrate and if a lower end of the spacer is closely attached to a pixel defining layer, it is difficult for air to flow between districted sections separated by the spacer. Therefore, as a pressure roller moves on the upper substrate or the lower substrate, with a plurality of spacers therebetween, to attach a polarizing film, the pressure in the space between the upper substrate and the lower substrate may be concentrated on one side. However, the spacer 18 according to the current exemplary embodiment not only supports and separates the upper substrate 22 and the lower substrate 10, but also includes the air holes 20 to allow gas to be exchanged between sections, divided by the spacer 18, formed in the space between the upper and lower substrates 22 and 10, respectively. The spacer 18 will be described in greater detail later.

The upper substrate 22 faces the lower substrate 10, and may be made of substantially the same material as the lower substrate 10.

Although not shown in the drawings, the organic light-emitting display device according to the current exemplary embodiment may further include a polarizing film attached to a surface of at least one of the lower substrate 10 and the upper substrate 22. If the polarizing film is attached to the lower substrate 10, it may be attached to a lower surface of the lower substrate 10. If the polarizing film is attached to the upper substrate 22, it may be attached to an upper surface of the upper substrate 22. That is, the polarizing film may be attached to an outer surface of the display panel.

Spacers according to exemplary embodiments of the present invention will now be described in more detail.

Figure 3A:
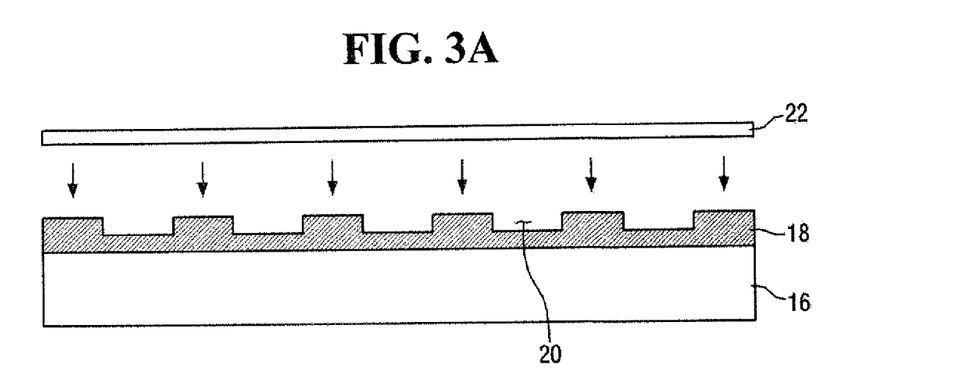
FIGS. 3A and 3B are cross-sectional views illustrating the structure of a spacer included in the organic light-emitting display device of FIG. 2.
Figure 3B:
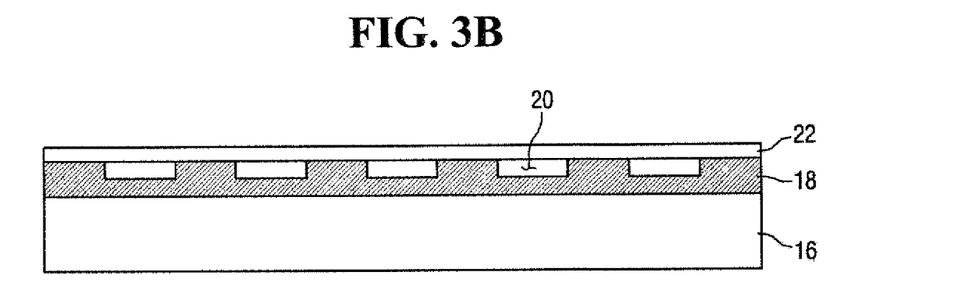

FIGS. 3A and 3B are cross-sectional views illustrating the structure of a spacer included in the organic light-emitting display device of FIG. 2. More specifically, FIGS. 3A and 3B are a cross-section of the spacer 18 of FIG. 2, taken along a direction perpendicular to the cross-section of FIG. 2.

The spacer 18 according to the current exemplary embodiment is formed on the pixel defining layer 16 and is in the shape of a line, that is, it extends a long way in a direction. The air holes 20 are formed in predetermined regions of the spacer 18. Accordingly, air, particularly, nitrogen gas filling the space between the upper and lower substrates 22 and 10, respectively, which are sealed together, can circulate throughout the entire region of the panel.

The spacer 18 may be made of PSPI, and may be formed of the same material as the pixel defining layer 16 thereunder.

The sum of a height of the spacer 18 and a height of the pixel defining layer 16 may be 4 to 8 μm.

The air holes 20 may be formed in a surface of the spacer 18 on the side of the upper substrate 22, and may penetrate the spacer 18 in a direction perpendicular to a lengthwise direction of the spacer 18.

Therefore, although the spacer 18 is formed on the pixel defining layer 16 and the upper substrate 22 is bonded to the spacer 18 as shown in FIG. 3B, since gas inside the panel can flow through the air holes 20 of the spacer 18, the pressure inside the panel can be maintained uniform. In particular, even when a pressure roller applies pressure to the whole surface of a substrate in order to attach a polarizing film to the substrate as will be described later, the air holes 20 can prevent the pressure inside the panel from increasing sharply on one side.

Figure 4A:
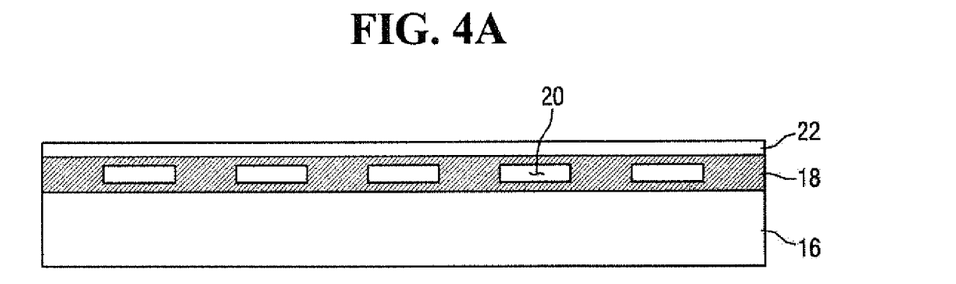
FIGS. 4A and 4B are cross-sectional views illustrating various forms of air holes which can be provided in the spacer of the organic light-emitting display device of FIG. 2.
Figure 4B:
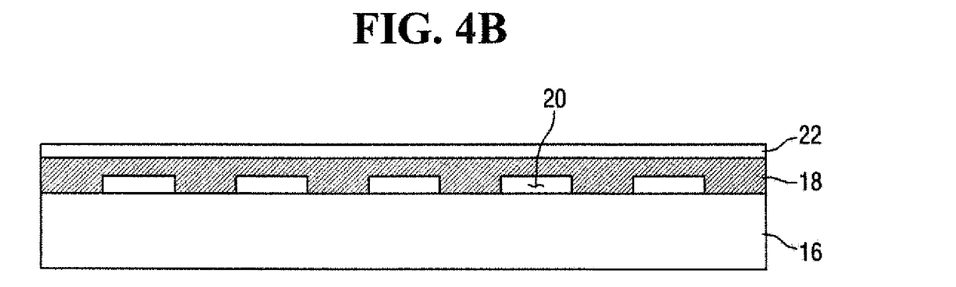

FIGS. 4A and 4B are cross-sectional views illustrating various forms of air holes which can be provided in the spacer of the organic light-emitting display device of FIG. 2. More specifically, FIGS. 4A and 4B illustrate various forms of air holes 20 formed in the spacer 18 of FIG. 2.

There are no restrictions on the shape, position and number of air holes 20 formed in the spacer 18 of the organic light-emitting display device according to the current exemplary embodiment.

For example, the air holes 20 may be formed in a middle region of the spacer 18 so as to penetrate the spacer 18 as shown in FIG. 4A, or they may be formed in a lower region of the spacer 18 so as to penetrate the spacer 18 as shown in FIG. 4B.

In addition, while the air holes 20 shown in FIGS. 4A and 4B are square, they can have various shapes, such as circular and oval shapes, as long as nitrogen gas inside the panel can flow through the spacer 18.

In FIGS. 4A and 4B, the air holes 20 are formed at regular intervals. However, the present invention is not limited thereto, and the air holes 20 can also be formed at irregular intervals.

In the above-described organic light-emitting display device according to the current exemplary embodiment, the air holes 20 formed in the spacer 18 enable air to flow backward in a direction opposite to a direction in which a pressure roller 100 moves. Therefore, constant pressure can be maintained inside the panel.

The above-described components included in the organic light-emitting display device according to the current exemplary embodiment are merely an example. In other embodiments, the organic light-emitting display device may include different components, including a spacer having air holes.

That is, an organic light-emitting display device according to another exemplary embodiment of the present invention may include a lower substrate, an upper substrate facing the lower substrate, and a spacer disposed in the sealed space between the lower substrate and the upper substrate and dividing the space into two or more sections. In this regard, air holes are formed in the spacer, and air flows between the sections of the sealed space through the air holes.

In another embodiment, different components may be included between the lower substrate and the upper substrate, and the organic light-emitting display device may be of a bottom emission type or a top emission type. In addition, as in the previous exemplary embodiment, the air holes may be formed in an end of the spacer on the side of the upper substrate, and may penetrate a side surface of the spacer.

Hereinafter, a method of manufacturing an organic light-emitting display device according to an exemplary embodiment of the present invention will be described with reference to FIG. 5.

Figure 5:
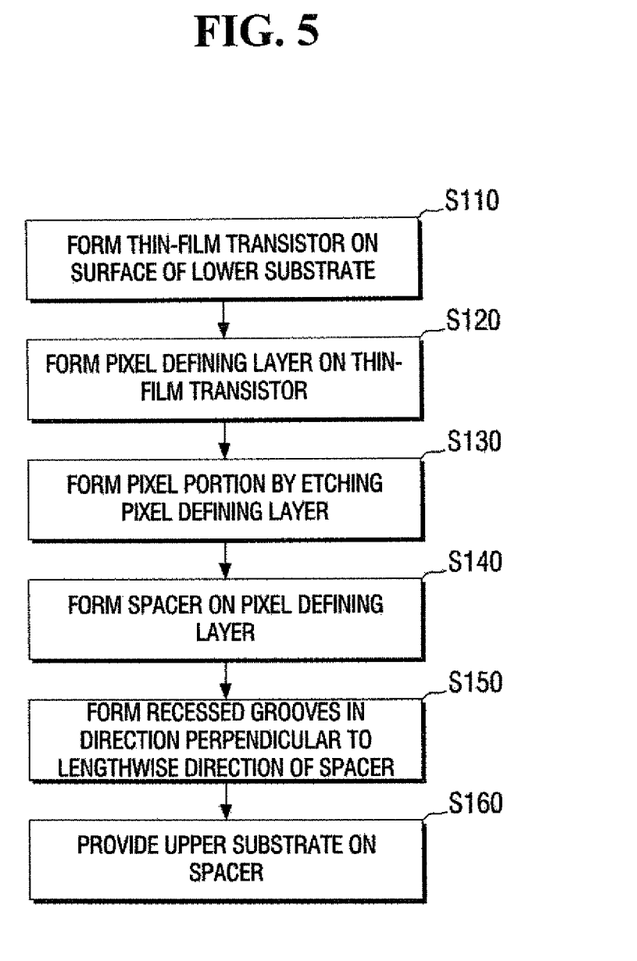
FIG. 5 is a flowchart illustrating a method of manufacturing an organic light-emitting display device according to an exemplary embodiment of the present invention.

FIG. 5 is a flowchart illustrating a method of manufacturing an organic light-emitting display device according to an exemplary embodiment of the present invention.

The method of manufacturing an organic light-emitting display device according to the current exemplary embodiment includes forming a TFT on a surface of a lower substrate (operation S110), forming a pixel defining layer on the TFT (operation S120), forming a pixel portion by etching the pixel defining layer (operation S130), forming a spacer on the pixel defining layer (operation S140), forming recessed grooves in the spacer in a direction perpendicular to a lengthwise direction of the spacer (operation S150), and providing an upper substrate on the spacer (operation S160).

Specifically, a TFT is formed on a surface of a lower substrate (operation S110). The TFT may include an active layer performing a semiconductor function, a gate insulating film protecting the active layer, a gate electrode formed on the gate insulating film, an interlayer insulating film protecting the gate electrode, and source/drain electrodes disposed on the interlayer insulating film and connected to the active layer. However, the present invention is not limited thereto, and various modified examples may be implemented.

Next, a pixel defining layer is formed (operation S120), and a pixel portion is formed by etching the pixel defining layer (operation S130).

The pixel defining layer is disposed on the source/drain electrodes so as to cover the source/drain electrodes and so as to protect internal components from the outside environment. The pixel defining layer forms the pixel portion which exposes all or part of a pixel electrode. An organic layer, including an electron transporting layer, an electron injecting layer, a hole transporting layer, and a hole injecting layer, may be formed on the pixel electrode in the pixel portion.

As described above, the pixel defining layer may be made of an organic material containing one or more materials selected from a PSPI material, an acrylic material, a siloxane material and a novolac material, or an inorganic material such as SiOx or SiNx.

Next, a spacer is formed on the pixel defining layer (operation S140). The spacer may be formed on the pixel defining layer in the shape of a line. The spacer maintains a predetermined gap between an upper substrate and the lower substrate, and protects the internal components.

The spacer may be made of the same material as the pixel defining layer. Alternatively, the spacer may be replaced by a portion of the pixel defining layer which protrudes upward. That is, when the pixel defining layer is etched, a portion of the pixel defining layer may be etched differently from other portions of the pixel defining layer. Accordingly, the portion of the pixel defining layer is higher than the other portions of the pixel defining layer, and can be used as the spacer.

Next, recessed grooves are formed in the spacer in a direction perpendicular to a lengthwise direction of the spacer (operation S150). The recessed grooves allow gas in the space between the upper and lower substrates to flow between sections into which the space is divided by the spacer, thereby maintaining constant pressure inside the space.

The spacer may be made of PSPI, and may be made of the same material as the pixel defining layer thereunder. The sum of a height of the spacer and a height of the pixel defining layer may be 4 to 8 μm.

The recessed grooves may be formed at arbitrary positions in the spacer and may penetrate the spacer in the direction perpendicular to the lengthwise direction of the spacer.

The recessed grooves can be formed at any position and to any depth, and part of the pixel defining layer can be exposed by the recessed grooves. That is, the spacer can be divided into a plurality of regions by the recessed grooves.

The recessed grooves may be cut into an upper surface of the spacer (i.e., a surface of the spacer on the side of the upper substrate).

The recessed grooves may be formed by an etching method using a mask. However, the present invention is not limited thereto. The recessed grooves can also be formed by intensively exposing part of the upper surface of the spacer using an exposure tool which is used in photolithography.

For example, if the spacer is made of PSPI, grooves may be formed using an exposure tool. In addition, if portions of the spacer are exposed at a resolution corresponding to a predetermined proportion, e.g., 30 to 60% of the resolution of the exposure tool, recessed grooves with gentle profiles can be formed due to the difference between the resolution and the exposure range.

For example, when the resolution of the exposure device is 3 to 4 μm, portions of the spacer may be exposed at a resolution of 1 to 2 μm so as to form gently recessed grooves.

The upper substrate is provided on the spacer having the recessed grooves (operation S160), thereby completing the organic light-emitting display device.

Hereinafter, a method of manufacturing an organic light-emitting display device according to another exemplary embodiment of the present invention will be described with reference to FIG. 6.

Figure 6:
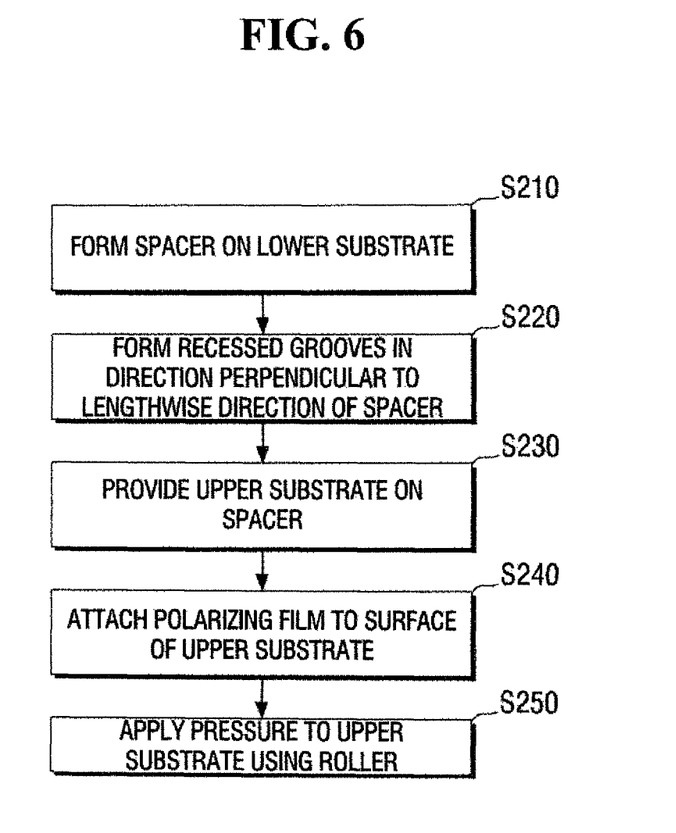
FIG. 6 is a flowchart illustrating a method of manufacturing an organic light-emitting display device according to another exemplary embodiment of the present invention.

FIG. 6 is a flowchart illustrating a method of manufacturing an organic light-emitting display device according to another exemplary embodiment of the present invention.

The method of manufacturing an organic light-emitting display device according to the current exemplary embodiment includes forming a spacer on a lower substrate (operation S210), forming recessed grooves in the spacer in a direction perpendicular to a lengthwise direction of the spacer (operation S220), providing an upper substrate on the spacer (operation S230), attaching a polarizing film to a surface of the upper substrate (operation S240), and applying pressure to the upper substrate using a roller (operation S250).

The manufacturing method according to the current exemplary embodiment is similar to the manufacturing method according to the previous exemplary embodiment, except that it further includes attaching the polarizing film to the surface of the upper substrate (operation S240) and applying pressure to the upper substrate using the roller (operation S250).

That is, the polarizing film is aligned with a side of the upper substrate, and is then firmly attached to the entire surface of the upper substrate by pressing the polarizing film against the upper substrate from the side of the upper substrate using the roller.

In this regard, the spacer formed between the upper substrate and the lower substrate extends in a direction in the shape of a long line. As the roller moves in the direction perpendicular to the lengthwise direction of the spacer, it presses the polarizing film against the upper substrate, thereby attaching the polarizing film to the upper substrate.

Although the roller presses the polarizing film against the upper substrate, the pressure in the space between the upper and lower substrates does not increase in the direction in which the roller moves due to the recessed grooves formed in the spacer. The recessed grooves allow gas to flow backward in a direction opposite to the direction in which the roller moves, thereby maintaining the internal pressure uniform.

Therefore, even when the polarizing film and the upper substrate are pressed against each other by the pressure roller so as to attach the polarizing film to the upper substrate, the pressure in the space between the upper and lower substrates, which are sealed together, can be maintained constant. Thus, damage to a sealant or the upper substrate can be prevented.

Hereinafter, the process of attaching a polarizing film to a substrate included in the manufacturing method of FIG. 6 will be described with reference to FIGS. 7A thru 7C.

Figure 7A:
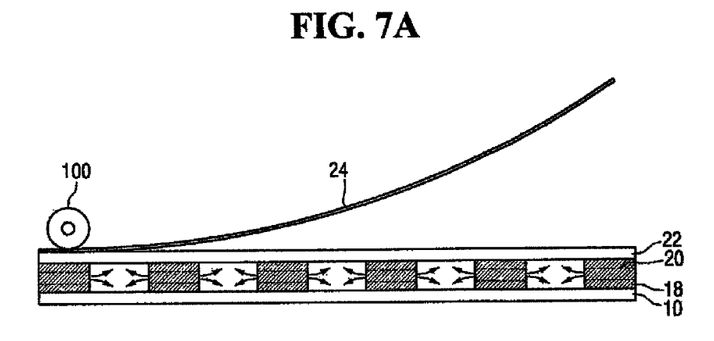
Figure 7B:
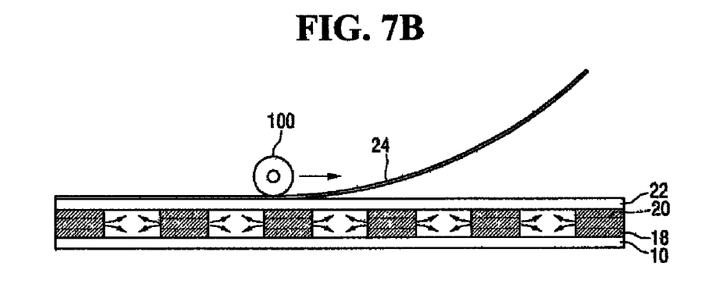
Figure 7C:
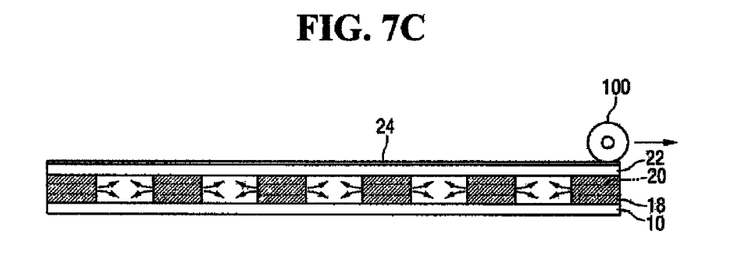

FIGS. 7A thru 7C are views sequentially illustrating the process of attaching a polarizing film to a substrate included in the manufacturing method of FIG. 6.

A polarizing film 24 attached to a substrate of the organic light-emitting display device according to the current exemplary embodiment may be attached to a surface of the upper substrate 22 or the lower substrate 10, and may inhibit a mirror effect of the display device caused by reflection of external light.

That is, if external light enters the organic light-emitting display device through a substrate and then exits after being reflected, the mirror effect occurs, resulting in a reduction in the readability of information or an image displayed on the organic light-emitting display device. To prevent this problem, the polarizing film 24 is attached to the substrate. The polarizing film 24 can suppress the mirror effect by keeping external light reflected inside the organic light-emitting display device from coming out of the display device.

The polarizing film 24 may be attached to an exit surface, that is, attached onto the upper substrate 22 in the case of a top emission organic light-emitting display device or attached onto the lower substrate 10 in the case of a bottom emission organic light-emitting display device.

The process of attaching the polarizing film 24 to a substrate will now be described. In FIGS. 7A thru 7C, the polarizing film 24 is attached to the upper substrate 22. However, the panel formed by bonding the upper and lower substrates 22 and 10, respectively, together can be rotated 180 degrees, and then the polarizing film 24 can be attached to the lower substrate 10. For ease of description, a case where the polarizing film 24 is attached onto the upper substrate 22 will be described below as an example.

Referring to FIG. 7A, an end of the polarizing film 24 is aligned with a side of the upper substrate 22, and a pressure roller 100 is placed on one end of the polarizing film 24. The pressure roller 100 presses the polarizing film 24 against the upper substrate 22 with one roller surface. In addition, the pressure roller 100 may include a pair of rollers and attach the polarizing film 24 to the upper substrate 22 using a rolling method.

Referring to FIGS. 7B and 7C, the pressure roller 100 attaches the polarizing film 24 to the whole surface of the upper substrate 22 as it moves from one side of the upper substrate 22 to the other side of the upper substrate 22.

In the conventional art, as a pressure roller moves while applying pressure to a surface of a substrate, the pressure in the space between upper and lower substrates increases along a direction in which the pressure roller moves. That is, gas in the space accumulates along the direction in which the pressure roller moves, thereby significantly increasing the internal pressure. The increased pressure damages a sealant, spacers, or the upper or lower substrate in front of the pressure roller in motion.

However, in the organic light-emitting display device according to the current exemplary embodiment, since the air holes 20 are formed in each spacer 18 which supports the lower and upper substrates 10 and 22, respectively, air can freely flow between sections into which the space between the lower and upper substrates 10 and 22, respectively, is divided by the spacers 18. That is, gas in the space between the lower and upper substrates 10 and 22, respectively, can be prevented from accumulating along the direction in which the pressure roller 100 moves, and thus increasing the internal pressure in some areas.

A more detailed description of the above process will be given with reference to FIGS. 8A thru 8C.

Figure 8A:
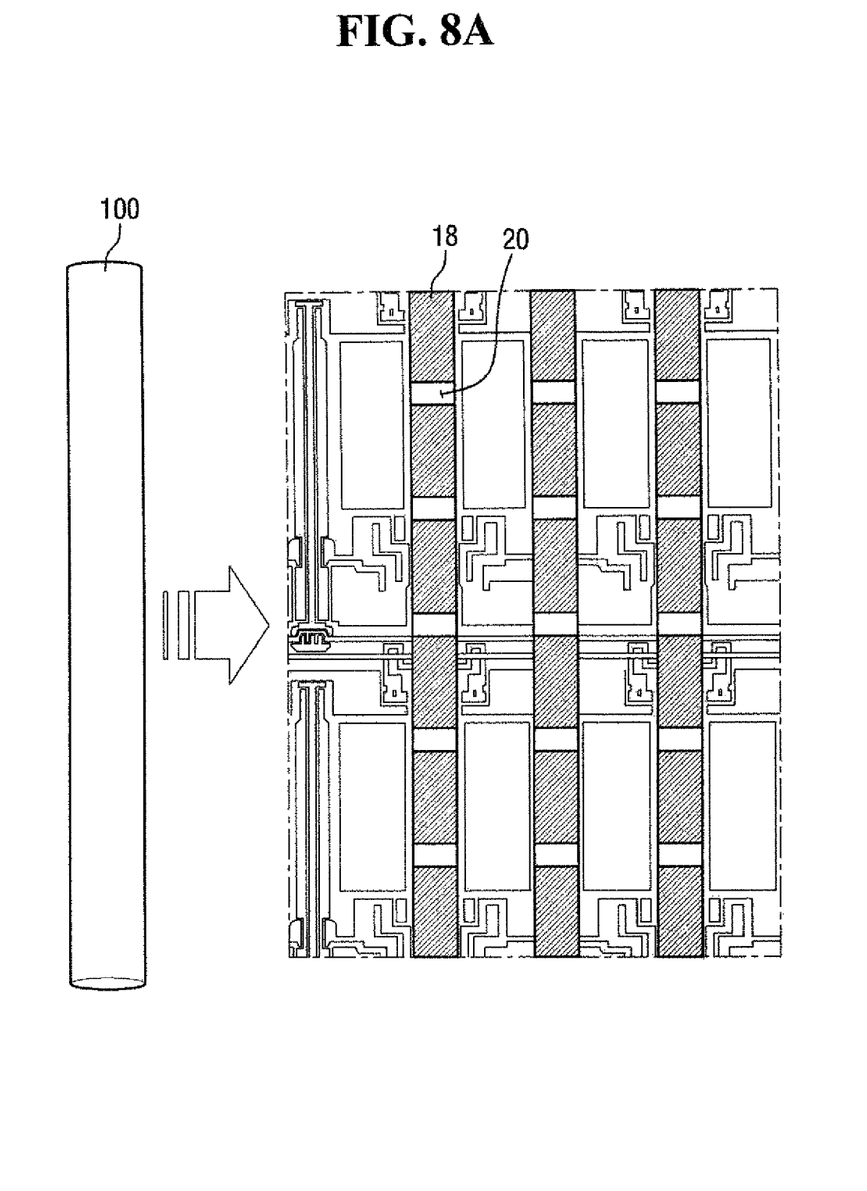
Figure 8B:
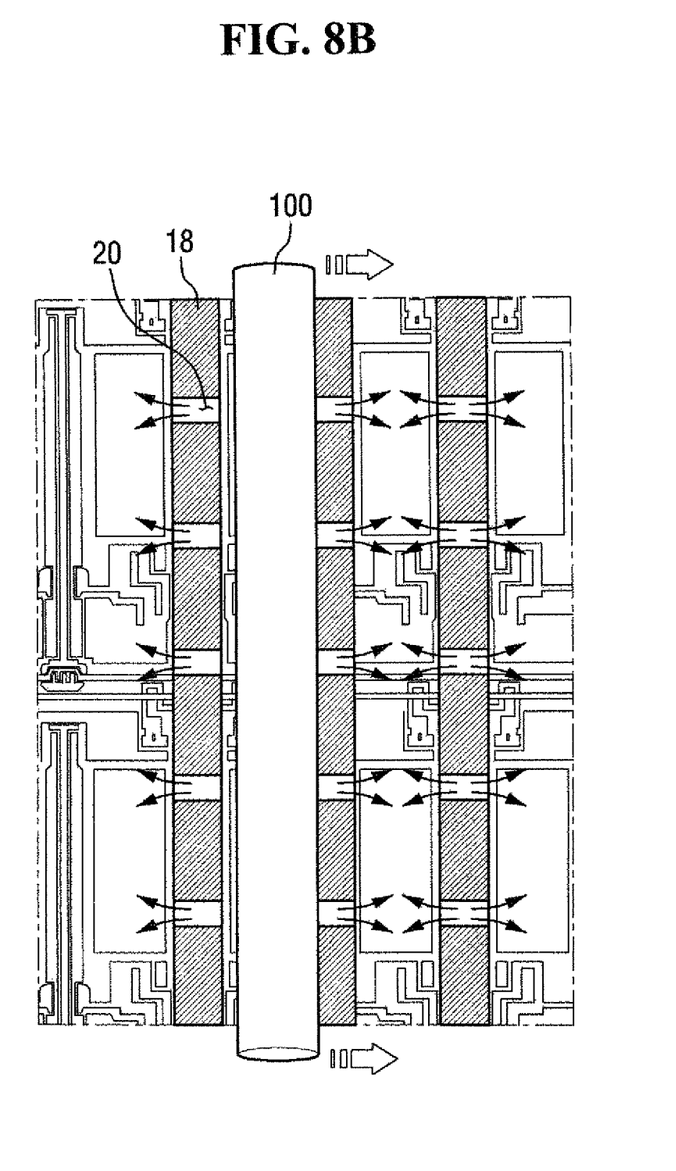
Figure 8C:
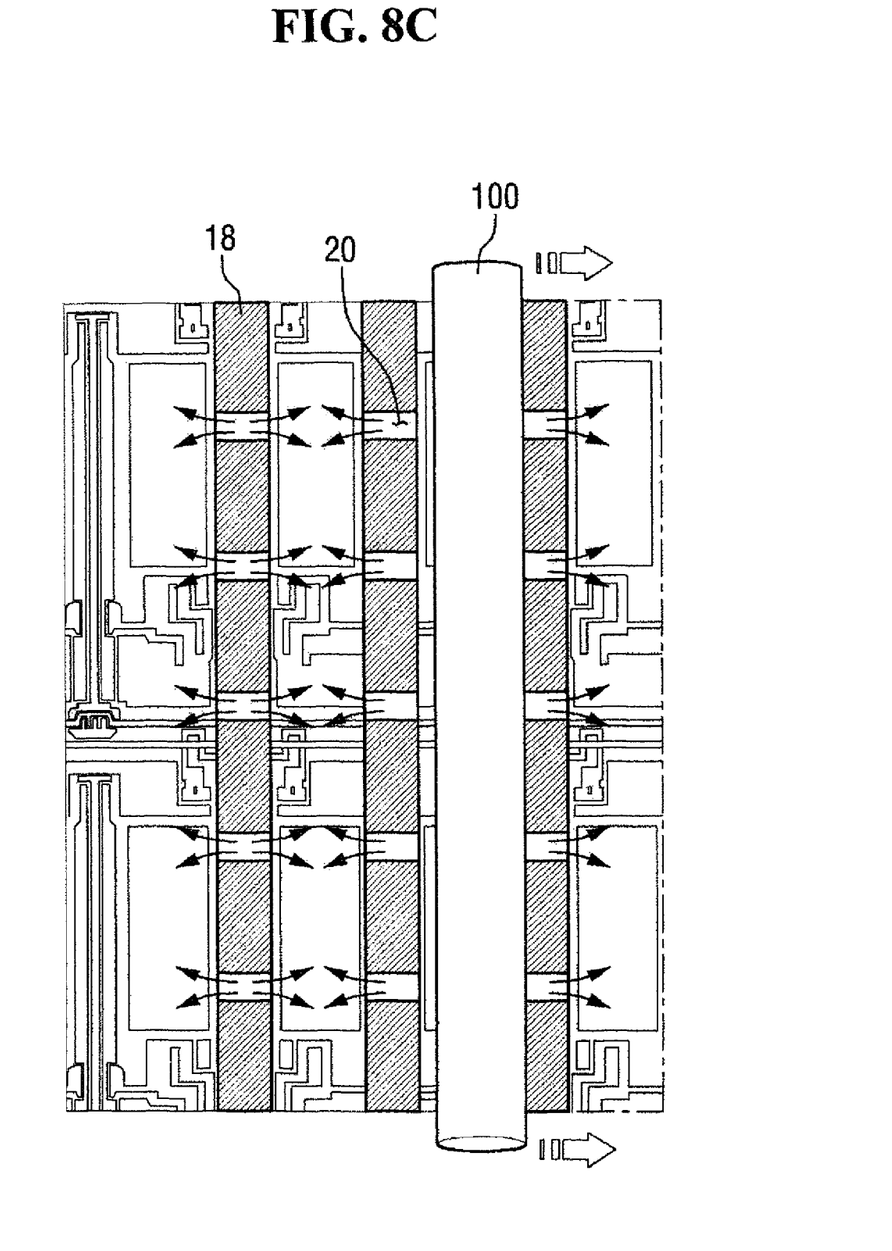

FIGS. 8A thru 8C are plan views illustrating the process of attaching a polarizing film to the upper surface of the upper substrate 22.

The pressure roller 100 presses a polarizing film against the upper substrate 22 as it moves in a direction indicated by an arrow in FIG. 8A. Here, the air holes 20 formed in each line-shaped spacer 18 prevent the air inside the panel from accumulating along the direction in which the pressure roller 100 moves. Since the internal gas can flow backward in a direction opposite to the direction in which the pressure roller 100 moves, the pressure inside the panel is distributed, and is thus maintained uniform. In addition, a sealant, the spacers 18, or the upper or lower substrate 22 or 10, respectively, can be prevented from being damaged in the process of attaching the polarizing film to the upper substrate 22.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. An organic light-emitting display device, comprising:
   a lower substrate;
   an upper substrate facing the lower substrate; and
   a plurality of spacers formed in a sealed space between the lower substrate and the upper substrate dividing the sealed space into a plurality of sections, each of said plurality of spacers having a rectangular shape and traversing an entire width of the lower and upper substrate with each of the plurality of sections positioned between adjacent spacers of the plurality of spacers;
   wherein a plurality of air holes are formed in each of the plurality of spacers and allow air to flow between adjacent sections of the plurality of sections of the sealed space, the plurality of air holes do not come in contact with the upper and lower substrate.

2. The display device of claim 1, wherein the plurality of air holes are formed in an end of the spacer on a side of the upper substrate.

3. The display device of claim 1, wherein the plurality of air holes penetrate a side surface of the spacer.

4. An organic light-emitting display device, comprising:
   a lower substrate;
   a thin-film transistor formed on a surface of the lower substrate;
   a pixel portion defined by a pixel defining layer, and having an organic layer which emits light when receiving a driving voltage from the thin-film transistor;
   a spacer formed on the pixel defining layer in a shape of a six sided prism;
   an upper substrate closely attached to the spacer, and facing the lower substrate with a predetermined gap therebetween; and
   a plurality of air formed in the spacer and allowing air to flow through the spacer, the plurality of air holes do not come in contact with the upper and lower substrate and the spacer extends an entire width of the lower and upper substrate.

5. The display device of claim 4, wherein the plurality of air holes are formed in a surface of the spacer on a side of the upper substrate, and penetrate the spacer in a direction perpendicular to a lengthwise direction of the spacer.

6. The display device of claim 4, wherein the spacer is made of a same material as the pixel defining layer.

7. The display device of claim 4, wherein the spacer is a portion of the pixel defining layer which protrudes upward.

8. The display device of claim 4, wherein the plurality of air holes penetrate the spacer in a vertical direction so as to expose part of the pixel defining layer.

9. A method of manufacturing an organic light-emitting display device, the method comprising the steps of:
   forming a thin-film transistor on a surface of a lower substrate;
   forming a pixel defining layer on the thin-film transistor;
   forming a pixel portion by etching the pixel defining layer;
   forming a spacer on the pixel defining layer, said spacer having a six sided prism shape;
   forming recessed grooves in the spacer in a direction perpendicular to a lengthwise direction of the spacer; and
   providing an upper substrate on the spacer, said spacer extending an entire width of the upper substrate.

10. The method of claim 9, wherein the spacer is made of a same material as the pixel defining layer.

11. The method of claim 9, wherein the step of forming the spacer comprises making a portion of the pixel defining layer protrude upward.

12. The method of claim 9, wherein the step of forming the recessed grooves comprises exposing part of the pixel defining layer by the recessed grooves.

13. The method of claim 9, wherein the step of forming the recessed grooves comprises exposing portions of the spacer at a resolution corresponding to 30 to 60% of a resolution of an exposure tool.

14. The method of claim 9, wherein the step of forming the recessed grooves comprises exposing portions of the spacer at a resolution in a range of 1 to 2 μm.

15. A method of manufacturing an organic light-emitting display device, the method comprising the steps of:
   forming a spacer on a lower substrate, said spacer having a six sided prism shape and extending an entire width of the lower substrate;
   forming recessed grooves in the spacer in a direction perpendicular to a lengthwise direction of the spacer;
   providing an upper substrate on the spacer;
   attaching a polarizing film to a surface of the upper substrate; and
   applying pressure to the upper substrate using a roller.

16. The method of claim 15, wherein the step of applying the pressure using the roller is performed in the direction perpendicular to the lengthwise direction of the spacer.

17. The method of claim 15, wherein the step of applying the pressure to the upper substrate using the roller comprises using the recessed grooves to allow gas to flow backward in a direction opposite to a direction in which the roller moves so that internal pressure is evenly distributed.

* * * * *